United States Patent [19]

Gieskes

[11] Patent Number: 5,739,846
[45] Date of Patent: Apr. 14, 1998

[54] METHOD OF INSPECTING COMPONENT PLACEMENT ACCURACY FOR EACH FIRST SELECTED CIRCUIT BOARD TO BE ASSEMBLED OF A BATCH

[75] Inventor: Koen A. Gieskes, Binghamton, N.Y.

[73] Assignee: Universal Instruments Corporation, Binghamton, N.Y.

[21] Appl. No.: 596,499

[22] Filed: Feb. 5, 1996

[51] Int. Cl.$^6$ ................................................. H04N 7/18
[52] U.S. Cl. ............................ 348/87; 348/86; 348/94; 348/95; 348/125
[58] Field of Search ........................... 348/87, 86, 94, 348/95, 125, 126, 129, 133

[56] References Cited

U.S. PATENT DOCUMENTS

| | | | |
|---|---|---|---|
| 5,408,538 | 4/1995 | Kitakado et al. | 382/8 |
| 5,455,870 | 10/1995 | Sepai et al. | 348/147 |
| 5,471,310 | 11/1995 | Spigarelli et al. | 348/87 |
| 5,517,235 | 5/1996 | Wasserman | 348/126 |
| 5,541,834 | 7/1996 | Tomigashi et al. | 364/167.01 |
| 5,550,583 | 8/1996 | Amir et al. | 348/126 |
| 5,555,316 | 9/1996 | Tsujikawa et al. | 348/129 |
| 5,608,453 | 3/1997 | Gerber et al. | 348/129 |
| 5,621,811 | 4/1997 | Roder et al. | 348/147 |

*Primary Examiner*—Tommy P. Chin
*Assistant Examiner*—Anand S. Rao
*Attorney, Agent, or Firm*—Banner & Witcoff, Ltd.

[57] ABSTRACT

An improved method for inspecting assembled circuit boards utilizes an existing programmable placement machine having an associated downward looking camera, illumination source, and monitor. After assembling a first circuit board of a series with electrical components according to a program which is particular to that series, and prior to removing the assembled board from the machine, an inspection is performed by: (i) automatically repositioning the relative position of the camera and the assembled circuit board, according to a portion of that same particular program, in order to address each placement position in turn; (ii) automatically acquiring an image of each placement position when it is addressed, and furnishing the image to the monitor in order to provide a magnified image on the monitor screen; (iii) visually inspecting the magnified image on the monitor screen in order to ascertain the presence or absence of the component at each placement position, the deviation in X, Y, and θ of the component relative to the desired placement position and/or the accuracy of connection of component leads to their respective lands on the circuit board; and (iv) providing for human control of the time expended at each placement position during the inspecting and correcting the program with any ascertained deviation.

9 Claims, 1 Drawing Sheet

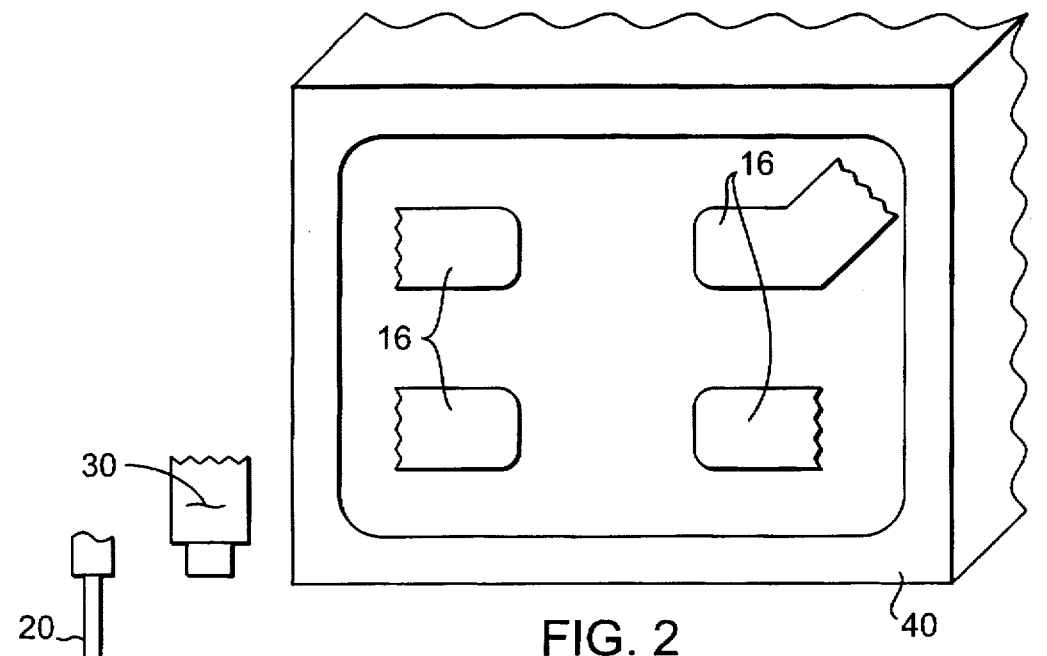
FIG. 2
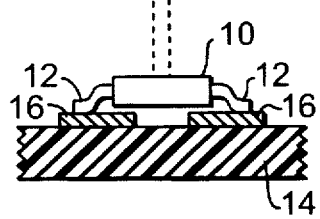
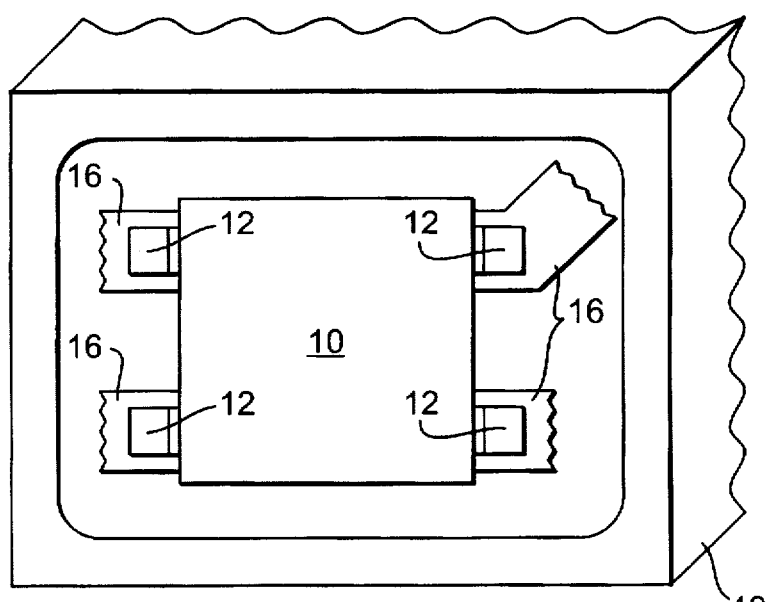
FIG. 1
FIG. 3

METHOD OF INSPECTING COMPONENT PLACEMENT ACCURACY FOR EACH FIRST SELECTED CIRCUIT BOARD TO BE ASSEMBLED OF A BATCH

BACKGROUND OF THE INVENTION

The invention is in the field of automated assembly of circuit boards with electrical components and, more particularly, deals with an improved method for checking the presence and accuracy of placement of the components at each placement position on the circuit board.

In the placing and mounting of so-called surface mount components (SMC's) on circuit boards by means of automated machinery, each machine is operated according to a programmed controller so that each group of circuit boards requiring like components at like placement locations on the circuit board may be processed as a "batch" under control of the same program.

It is a prudent and usual practice to assemble and inspect the first board of each such batch, prior to assembling the remainder of the batch, so as to ensure that a component is placed at each placement site that is to be addressed according to a particular program and that each placed component meets specified placement tolerances in X, Y, and θ.

When the volume of boards in each batch being processed is sufficient, it is good practice also to inspect the first board in each consecutive series of a hundred or so boards. For purposes of the remaining disclosure, it is intended that the term "first board" refers to the first of such a series as well as the first board of a batch.

Such board inspection generally is performed via the human eye, with or without the aid of a magnifying lens, as the case may be. With miniaturization of components, distances between connection points for each lead has shrunk and component density has increased to the point that inspecting a finished board is tedious and not always methodically complete or accurate unless inspected by complex and costly off-line automated inspection equipment.

Thus, it is an object of this invention to improve inspection of assembled circuit boards with the human eye. In so doing, the existing capabilities of component placement machinery are utilized in a manner that is both methodical and accurate and much more easily accomplished than present human inspection practices.

BRIEF SUMMARY OF THE INVENTION

An improved method for inspecting assembled circuit boards utilizes the programmable placement machine having an associated downward looking camera, illumination source, and monitor. After assembling a first board with electrical components according to a program which is particular to that first board, and prior to removing the assembled board from the machine, an inspection is performed by: (i) automatically repositioning the relative position of the downward looking camera to the assembled circuit board, according to a portion of that same particular program, in order to readdress each placement position in turn; (ii) automatically acquiring an image of each placement position when it is repositioned, and furnishing the image to the monitor in order to provide a magnified image on the monitor screen; (iii) visually inspecting the magnified image on the monitor screen in order to ascertain the presence or absence of the component at each position, the positioning accuracy in X, Y, and θ of the component relative to the desired placement position and/or the accuracy of connection of component leads to their respective lands on the circuit board; and (iv) providing for human control of the time expended at each placement position during the inspecting.

BRIEF DESCRIPTION OF THE DRAWING

FIG. 1 is a schematic drawing, partially in cross-section, of component parts of a placement head while still at a placement position after placement of a component.

FIGS. 2 and 3 are schematic illustrations of a monitor's magnified image of the placement position before and after placement of a component, respectively, as recorded by the camera in FIG. 1.

DETAILED DESCRIPTION OF THE INVENTION

The method of the invention improves upon the known practice of visually inspecting for accuracy of placement of the first selected board of a series or batch of boards that are to be assembled automatically under the control of a particular program.

Referring to FIG. 1, a pick and place head (not shown) has a spindle, such as vacuum spindle 20, and a downward looking camera 30 which normally is used to acquire an image of a fiducial to allow calculation of a circuit boards true position and/or the placement position. Typically, an upward looking camera (not shown) is situated at a component inspection station, and the spindle 20 is passed over the upward looking camera while transporting a component from a pick-up (supply) station to the placement position in order to acquire an image of the bottom of the component. The images acquired by the two cameras are used then to determine the locations of each of the leads of the component relative to each corresponding solder pad of the placement position, while the component is held by the spindle and prior to placement. This acquired information is used to effect "off set" corrections, if required, in X, Y, and θ to the particular program, prior to placement.

Typically, the machine includes a camera monitor which is used during initial set-up and/or incremental programming of the machine, although the speed with which the machine operates during component placement is too fast for human inspection of component placement via the monitor image.

The improved method disclosed herein makes particular use of the downward looking camera and the image furnished to the monitor by this camera, along with a portion of the program used for assembling a circuit board, for inspecting every position on the board at which a component should be placed according to the program.

For example, as soon as assembly is completed on the first selected board under a particular program, the placement machine is stepped through the placement positions with appropriate "off set" correction if required, with an operator controlling the length of stay of the head over each placement position, so that the magnified image of the placement which is displayed on the monitor may be studied to ascertain that the component is present and properly oriented and, where possible, that each lead-to-pad placement position is accurate.

Thus, once the first selected board has been assembled at the normally high speed of a machine, a portion of the placement program is repeated by stepping the downward looking camera 30 through each of the placement positions so as to address each position and acquire an image thereof by the downward looking camera 30. Referring to FIG. 2, the monitor 40 presents to the operator a greatly magnified image of a placement position, as indicated by the solder pads of the conductive lands 16 of the printed circuit board. As seen in FIG. 3, the magnified image of the component 10 substantially fills the screen of monitor 40 so as to reduce eye strain and inspection mistakes resulting therefrom.

During inspection of the first board, the operator may cause the head to dwell at each placement position for a length of time necessary to view the magnified image of the component in the monitor and make a determination if the component is present and properly positioned in X, Y, and θ. Having done so, any further required "off sets" are recorded and the next placement position is addressed according to the placement program. If any additional "off set" corrections are obtained from this inspection of the first board, another first assembled board can be inspected, if necessary, prior to assembling the remainder of the circuit boards in the batch or series.

According to one embodiment of the invention, a button or switch is activated by the operator using a mouse or other form of I/O device, for each programmed placement position, according to the results of his or her inspection of the position. Activation of either an OK or a NOT OK button results in automatic stepping of the program to address the next placement position. Thus, each component placement accuracy that does not meet a pre-set limit is recordable for subsequent correction, as well as for collection of statistical data on machine performance and reliability.

When the magnified image of the component is larger than the screen of monitor 40, provision is made for the inspector to "jog" the camera 30 relative to the addressed placement position by "clicking" (e.g., by use of a mouse) on arrows which may be provided on the screen of monitor 40. Once the component has been completely inspected, the operator actuates the appropriate OK or NOT OK button and the program is stepped to the next placement position to be addressed by the machine.

It is contemplated that inspection of each component by the method of the invention could also include displaying on the monitor screen, for each placement position that is addressed, a template or transparency portraying the component outline for that position. Preferably, the portrayed component outline would conform to the correct component for that position in size and orientation (and, perhaps color), so as to require only a simple comparison of the actual and portrayed component images to implement the inspection. To this effect, a library of the templates or transparencies in the controller memory would be available for access during the inspection process.

It is contemplated also that the inspection may be semi-automated by using the image of the placed component or a library of templates or transparencies and comparing them to particular features of the component and/or placement position. It may be desirable also to use various grey scale grading techniques in comparing each component and/or placement position. Therefore, such a semi-automated inspection could be performed so that any deviation in desired accuracy in X, Y, and θ could be determined for each placement position and this information fed back to the original program for correction based on actual machine performance.

Thus, it will be seen that the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

It is to be understood also that the following claims are intended to cover all of the generic and specific features of the invention herein described, and all statements of the scope of the invention which, as a matter of language, might be said to fall therebetween.

I claim:

1. A method of inspecting a circuit board after completing assembly thereof by an assembly machine and verifying the presence, accuracy of placement, and correctness of each assembled component at each corresponding placement position of said circuit board, said circuit board having been assembled according to a particular program by sequentially addressing each said placement position with a pick and place spindle of said assembly machine and assembling each said component thereat by means of said spindle, said method comprising the steps of:

positioning a camera within said assembly machine after said assembly, said camera being capable of acquiring an image of each said assembled component and furnishing said image to a display screen on which said image is presentable in magnified form;

addressing each said placement position with its component assembled thereon sequentially with said camera, according to at least a portion of said program;

utilizing said camera for acquiring and furnishing an image of each said placement position and said assembled component thereat to said display screen so as to present thereon a magnified image; and visually monitoring said display screen and performing said inspecting by observing each said magnified image, in turn.

2. The method as in claim 1, and further comprising the step of:

controlling, by a human inspector, a dwell time at each said placement position during said addressing so as to ensure adequate inspection.

3. The method as in claim 1, and further comprising the step of:

providing means for an inspector to indicate go or no-go accuracy status at each addressed placement position; and automatically addressing a next placement position upon indication of said status being made.

4. The method as in claim 1, and further comprising the step of:

recording each fault with said assembled circuit board, as detected by a human inspector, for use after said inspecting is completed.

5. The method as in claim 1, and further comprising the steps of:

providing a template corresponding to each component to be inspected; and comparing each said template and corresponding component in order to facilitate said inspection.

6. The method as in claim 5, and further comprising the step of:

providing each said template as a transparency with at least an outline of said corresponding component situated upon said transparency.

7. The method as in claim 6, and further comprising the step of:

displaying said template upon said screen in proper proportion to and as an overlay of said corresponding component in order to facilitate said comparing.

8. The method as in claim 7, and further comprising the step of:

provinding that each said template also comprises at least an outline of portions of lands of a placement position corresponding to each placement position being addressed.

9. The method as in claim 1, and further comprising the step of:

providing means for a human inspector to determine any desired accuracy deviation in X, Y, and θ for each said assembled component; and correcting the particular program placement position of said assembled component according to the determined deviations in X, Y, and θ.

* * * * *